Dec. 3, 1957 E. PASKELL 2,814,853

MANUFACTURING TRANSISTORS

Filed June 14, 1956

INVENTOR.
Ernest Paskell

BY Gray, Mase & Dunson

ATTORNEYS.

2,814,853
Patented Dec. 3, 1957

2,814,853

MANUFACTURING TRANSISTORS

Ernest Paskell, Grove City, Ohio, assignor, by mesne assignments, to Power Equipment Company, Galion, Ohio, a corporation of Ohio Application June 14, 1956, Serial No. 591,490
6 Claims. (Cl. 29—25.3)

This invention relates to a method of manufacturing transistors. It has to do particularly with a simplified production method for making a plurality of transistors. Although the method is especially suited to the production of diffused junction transistors of large size, it is also applicable to the manufacture of other types and sizes of transistors.

In the past, transistors have been difficult to produce in large quantities because of the close dimensional control required to assure proper functioning of the transistors. The yield of acceptable transistors has been low, and it has not been possible to produce large quantities of transistors, especially power transistors, easily and cheaply.

The present invention provides an improved method for making transistors in which standard production equipment such as surface grinders can be used to obtain the required dimensional control and a higher yield of acceptable transistors.

Other advantages of this invention are: A large number of transistors can be fabricated on a single blank, thus reducing the handling of many small parts. All contacts to the base, collector, and emitter are made simultaneously to a large number of transistors. All of the emitter and collector junctions of a large number of transistors can be simultaneously etched without individual handling or special masking procedures. Wide variations in dimensions can be easily produced by merely modifying the arrangement of grinding wheels and spacers on the spindle of a precision surface grinder. Further advantages are also apparent from the disclosure herein.

Briefly, the present invention comprises, in a method of making transistors from a thin slice of semiconductor material having a pair of plane parallel outer surfaces and large enough to provide a plurality of transistors of predetermined size, comprising at each said outer surface a layer of said semiconductor material having conductivity of the type opposite to that of the intermediate portion of said semiconductor material between said layers, the steps of: removing portions of said semiconductor material at spaced regions on one said outer surface, through said surface layer therein to a depth between, and spaced from, both said surface layers, to expose substantial areas of said intermediate portion of said semiconductor material; treating said exposed areas of said intermediate portion of said semiconductor material to increase substantially in said areas the conductivity of the same type already present in said intermediate portion; depositing an electrical conductor material on said outer surfaces and on said exposed areas of said intermediate portion of said semiconductor material; removing portions of said conductor material and of said semiconductor material in spaced regions bordering on said regions removed earlier, through said surface layer to a depth less than the depth of the earlier removal, in such manner as to disconnect said conductor material deposited on said remaining outer surface regions from said conductor material deposited on said exposed areas of said intermediate portion of said semiconductor material; and cutting said semiconductor material along lines between said remaining outer surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion.

The starting material may be any suitable single-crystal semiconductor material such as germanium, silicon, aluminum antimonide, or gallium arsenide. Slices of the material are prepared by any of the usual methods such as diamond sawing, electrochemical slicing, or ultrasonic impact slicing. After the crystal is sliced, the pieces are ground to approximately twice the desired thickness of the transistors and are squared to provide rectangular slices. The initial squaring of the slices is done to facilitate registering each piece for subsequent grinding operations. For ease of handling and economy, the rectangular dimensions are chosen to provide the largest single piece obtainable from the original slice within multiples of the dimensions, including material to be cut away, required for each transistor.

Figure 1:
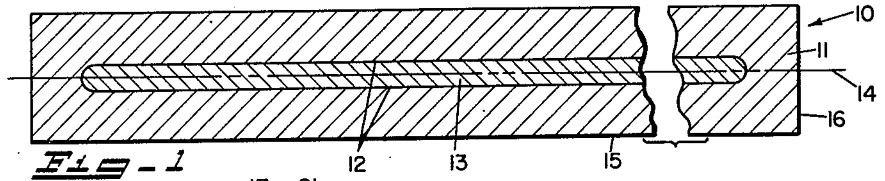
Fig. 1 is a highly magnified sectional view of a piece of a semiconductor material as used in the present invention.

Fig. 1 shows, in a highly magnified sectional view, a slice 10 of semiconductor material that has been prepared as described above. The surfaces should have a roughness in the order of that provided by 600-grit silicon carbide. The slice of semiconductor material 10 is subjected to a diffusion process, the diffusion material and other conditions being selected according to the characteristics required for the final device. For illustrative purposes a typical form of the process is described in which p-type silicon is used as the starting material. A layer of n-type silicon 11 is formed by diffusing a group V element such as phosphorus or antimony into the material 10. The line 12 indicates the junction between the n-type layer 11, produced by the diffusion, and the intermediate portion 13, which is still p-type.

The upper half of the slice 10 is removed, as by lapping, down to the plane indicated at 14, which is parallel to the lower surface 15 of the resulting thinner slice 16 comprising the portion of the slice 10 below the plane 14. The new upper surface 21 should have a roughness in the order of that provided by 600-grit silicon carbide.

Figure 2:
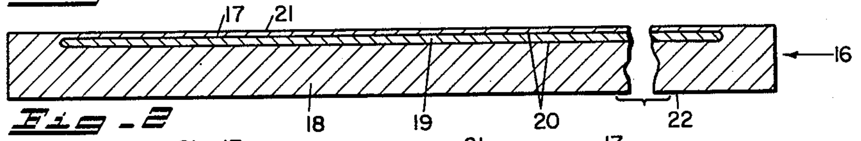
Fig. 2 is a similar view of the piece of semiconductor material of Fig. 1 in an early stage of preparation according to the present invention.

Referring now to Fig. 2, which is a view similar to Fig. 1, the slice 16 is further diffused with a group V element to provide a very thin n-type layer 17 on the upper surface of the slice 16. This diffusion causes incidental further penetration of the lower n-type layer, indicated at 18 in Fig. 2. The junction between the remaining p-type intermediate portion 19 and the n-type layers 17, 18 is indicated by the line 20 in Fig. 2. For best results, the upper n-type layer 17 is very thin and has a high conductivity gradient between the upper surface 21 of the slice 16 and the junction 20. This thin n-type layer 17 becomes the emitters of the transistors.

The emitter can be made in the same operation as the collector, if desired, thus eliminating several steps in the manufacturing process. However, the preferred method requires less perfect starting crystals, and the final operation of the device is less dependent upon processing conditions with the illustrated design. The lower n-type layer 18 should be much thicker than the layer 17, and thus should have a much smaller conductivity gradient between the lower surface 22 and the junction 20. The n-type layer 18 becomes the collectors of the transistors. The intermediate p-type region 19 becomes the bases of the transistors. With phosphorus as the diffusant, typical diffusing times and temperatures would be in the order of about 24 hours at about 1250° C. for the first diffusion step, and about 2 hours at about 1250° C. for the further diffusion, to provide a collector layer 18 about 0.0018 inch thick and an emitter layer 17 about 0.0005 inch thick.

The above procedure and results of diffusion are based on a surface solubility at 1250° C. of about $10^{21}$ atoms per $cm.^3$ of phosphorus in silicon and on a concentration-depth relationship as follows:

$$C = Co \text{ erfc } (x/\sqrt{4Dt})$$

where $C$=concentration at depth $x$
$Co$=surface concentration
$x$=depth of penetration
$D$=diffusion constant
$t$=diffusion time D, the diffusion constant, is approximately given by the expression $$D = 1 \times 10^{-3} \exp(-5.8 \times 10^4/RT)$$

where $R$=gas constant
$T$=absolute temperature

The diffusion process produces planar layers and is thus suitable for large-area devices such as power transistors. The graded collector junction increases the collector breakdown voltage and reduces the electric field at the surface 22. Minimizing electric fields at the collector surface 22 may be important to maintain a stable surface, and thus a stable transistor.

Figure 3:
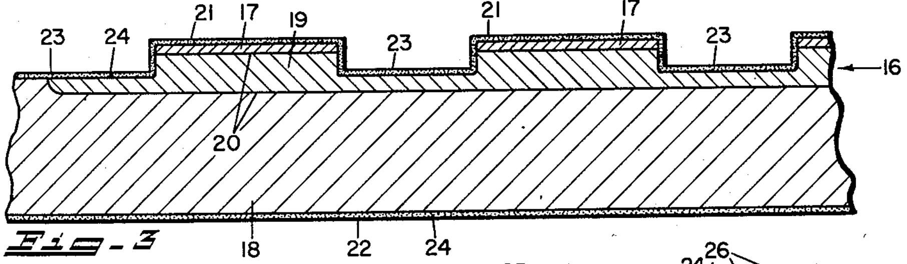
Fig. 3 is a more highly magnified sectional view of the piece of semiconductor material at an intermediate stage of the process according to the present invention.

Portions of the semiconductor slice 16 are removed at spaced regions on the emitter surface 21 through the emitter layer 17 to a depth between, and spaced from the n-type emitter layer 17 and the n-type collector layer 18, to expose substantial areas 23—23 of the intermediate p-type base portion 19, as shown in Fig. 3. The rectangular slices 16 may be mounted on a register plate of a grinding machine, such as a surface grinder. If a surface grinder is used, a slow table travel should be used and multiple grinding wheels, such as diamond wheels, and spacers should be mounted on the spindle. Vacuum chucking jigs simplify mounting of the blanks and insure metal-to-metal contact so that the depth of grind can be accurately controlled. The principal reason for this grinding step is to expose sufficient base areas 23—23 to permit making the base contact. A convenient width of each grind is about 0.015 inch. The depth of the grind should be held to a tolerance of about ±0.0002 inch to avoid removing too much base material. This can be readily accomplished with modern surface grinders.

The slice 16 is now diffused with a group III element such as boron to increase the p-type conductivity on a very thin surface layer 24, and thus to insure that the base contact will be noninjecting. The boron diffusion may typically take place for about one hour at about 1100° C. The p-type diffusion is needed only in the p-type base contact regions 23—23, but it enters also the n-type emitter layer 17 and the n-type collector layer 18. The surfaces 21, 22 of the n-type layers 17, 18 are so strongly n-type conductive, however, that the small amount of boron diffused into these layers is insignificant and does not affect their electrical properties to any measurable degree.

An electrical conductor material is deposited over the entire slice 16, covering the outer surfaces 21, 22 of the layers 17, 18 and the exposed areas 23—23 of the intermediate portion 19. The layer of deposited electrical conductor material is indicated at 25—25 in Fig. 4. The electrical contact depositing process may comprise depositing nickel from an electroless nickel bath, diffusing the nickel layer for several minutes at about 500–900° C., and then depositing a second nickel layer from the electroless nickel bath. In this contacting step, a good contact is provided to all three elements of the transistor simultaneously.

Portions of the conductor material 25 and of the semiconductor material 16 in spaced regions bordering on the regions removed earlier are now removed through the n-type emitter layer 17 to a depth less than the depth of the earlier removal, to disconnect the conductor material 25 deposited on the remaining outer surface regions 21—21 of the emitter layer 17 from the conductor material 25 deposited on the exposed areas 23—23 of the intermediate base portion 19. The cutting lines 26—26 in Fig. 4 indicate the locations of these removals. A convenient width for each removal is about 0.020 inch. The slices preferably are mounted between glass plates and are registered with respect to the first grind. Although various mounting materials may be used, mixtures of rosin and beeswax are recommended as they are easy to handle and provide satisfactory protection to the surfaces mounted in them.

Figures 4, 5:
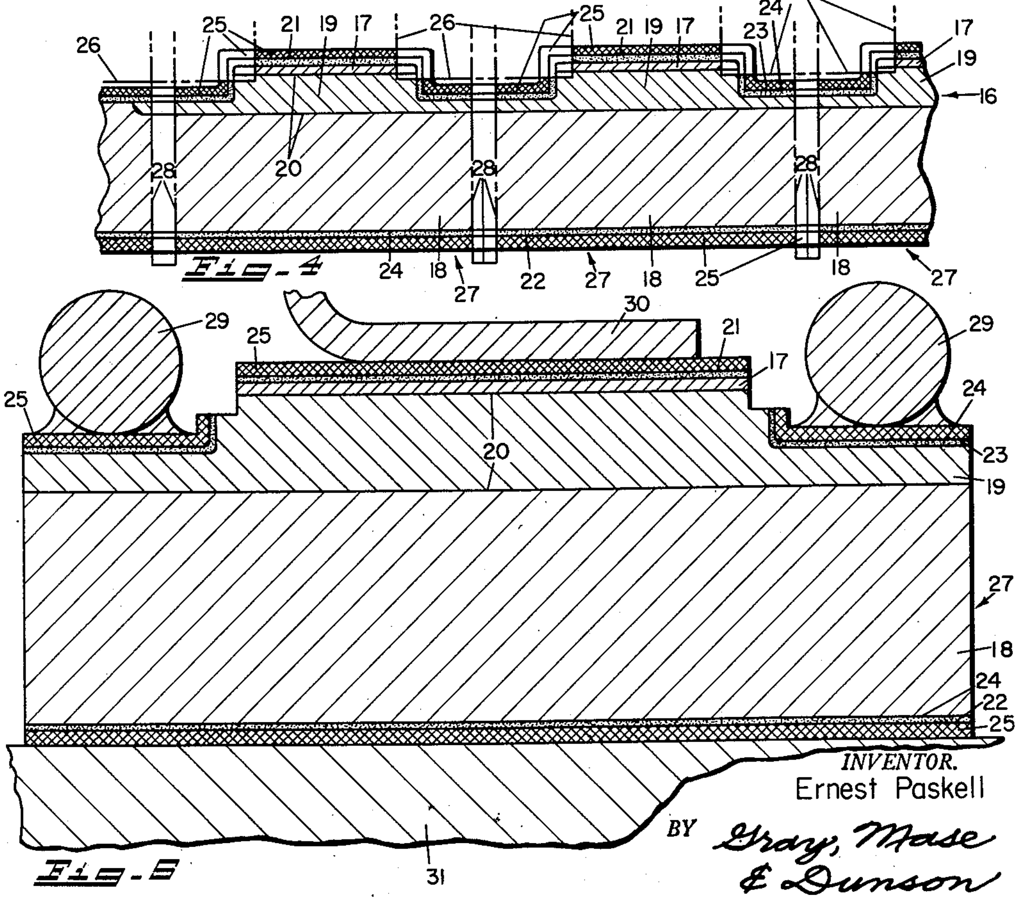
Fig. 4 is a view similar to Fig. 3 of the piece of semiconductor material at a later stage in the process.
Fig. 5 is a still more highly magnified sectional view of a transistor made from the piece of semiconductor material by the process of the present invention.

The slice 16 is next cut along lines between the remaining outer surface regions 21—21 so as to provide a plurality of pieces 27—27, each piece 27 having a conductor 25 in electrical contact with the intermediate portion 19, a conductor 25 in contact with the emitter layer 17 and a conductor 25 in contact with the collector layer 18. The cutting lines 28—28 in Fig. 4 show where the material is cut apart in this step.

In the second removal operation indicated at 26—26, thin diamond saws and spacers can be mounted on the spindle of a grinding machine as in the earlier removal operation. The depth of the grinding should be accurately controlled, to about ±0.0001 to 0.0002, in order to avoid cutting into the contact 25 on the surfaces 23—23 of the base region 19. If desired, the diamond saws can be shaped so as to provide the separating cut indicated at 28—28 at the same time.

With the individual pieces 27—27 still mounted in the wax-rosin mixture, all of the junctions can be strongly etched without damaging the transistor contacts 25—25. After the final sawing and etching, the individual transistors 27—27 can be removed from the mount and leads may be connected as by soldering. Fig. 5 shows a transistor 27 to which base leads 29—29, an emitter lead 30, and a collector lead 31 have been connected. The collector lead 31 preferably is made in the form of a case, in which the rest of the transistor 27 is hermetically sealed, with only the ends of the leads 29, 30 protruding.

If the depth, in the direction perpendicular to the cross sections shown in Figs. 1–5, of the slice 10 of semiconductor material is equal to the desired depth of the transistors 27—27, all of the grindings for the two base region removals and the separating cut involve only one pass each, along a line perpendicular to the paper in the views, Figs. 1–5, of the drawing. If the depth, in the direction perpendicular to the cross sections in Figs. 1–5, of the slice 10 of semiconductor material is greater than the desired depth of each of the transistors 27—27, an additional separating cut is made perpendicular to the separating cut indicated at 28—28 in Fig. 4.

If it is desired that the base contact 25 be continuous, an additional grinding pass perpendicular to that indicated at 23—23 in Fig. 3 may be made in the first removal step, and an additional grinding pass perpendicular to that indicated at 26—26 in Fig. 4 may be made in the second removal step, the slice 16 of semiconductor material being rotated 90 degrees between the passes in each removal step.

Typical thicknesses of the various portions of the transistor 27 are: the contacts 25—25, about 0.0002 inch; the boron-diffused layer 23—23, less than about 0.0001 inch; the n-type emitter layer 17, about 0.0005 inch; the p-type base layer 19 between the upper and lower junctions 20—20, about 0.0017 inch; and the n-type collector layer 18, about 0.0018 inch. These dimensions can be varied considerably to provide the desired characteristics for various types of transistor. The other dimensions can be varied over a wide range depending upon the power requirements and other characteristics desired. The dimensions used in the drawings were chosen for convenience in illustrating the present invention in a limited space, and are not intended to be to scale either in thicknesses or in widths. The general configuration of the transistor 27 is such that any of the dimensions can be varied easily. The width, depth, and spacings of the portions removed can be modified simply by changing the configuration of diamond wheels and spacers on the grinding spindle. Multiple base contacts can be used to reduce the base resistance and modify the distribution of emitter and collector current. The configuration of the transistor 27 is excellent for heat dissipation also, as the primary internal thermal dissipation taking place at the collector junction is in excellent thermal contact with the case 31, which serves as a heat sink.

While the form of the invention herein disclosed constitutes a preferred embodiment, there has been no attempt here to describe all of the possible equivalent forms or ramifications of the invention. It will be understood that the words used are words of description rather than of limitation, and that various changes may be made without departing from the spirit or scope of the invention herein disclosed.

What is claimed is:

1. In a method of making transistors from a thin slice of semiconductor material having a pair of plane parallel outer surfaces and large enough to provide a plurality of transistors of predetermined size, comprising at each said outer surface a layer of said semiconductor material having conductivity of the type opposite to that of the intermediate portion of said semiconductor material between said layers, the steps of: removing portions of said semiconductor material at spaced regions on one said outer surface, through said surface layer therein to a depth between, and spaced from, both said surface layers, to expose substantial areas of said intermediate portion of said semiconductor material; treating said exposed areas of said intermediate portion of said semiconductor material to increase substantially in said areas the conductivity of the same type already present in said intermediate portion; depositing an electrical conductor material on said outer surfaces and on said exposed areas of said intermediate portion of said semiconductor material; removing portions of said conductor material and of said semiconductor material in spaced regions bordering on said regions removed earlier, through said surface layer to a depth less than the depth of the earlier removal, in such manner as to disconnect said conductor material deposited on said remaining outer surface regions from said conductor material deposited on said exposed areas of said intermediate portion of said semiconductor material; and cutting said semiconductor material along lines between said remaining outer surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion.

2. In a method of making transistors from a thin slice of semiconductor material having a pair of plane parallel outer surfaces and large enough to provide a plurality of transistors of predetermined size, comprising at each said outer surface a layer of said semiconductor material having conductivity of the type opposite to that of the intermediate portion of said semiconductor material between said layers, the steps of: grinding away portions of said semiconductor material at spaced regions on one said outer surface, through said surface layer therein to a depth between, and spaced from, both said surface layers, to expose substantial areas of said intermediate portion of said semiconductor material; treating said exposed areas of said intermediate portion of said semiconductor material to increase substantially in said areas the conductivity of the same type already present in said intermediate portion; depositing an electrical conductor material on said outer surfaces and on said exposed areas of said intermediate portion of said semiconductor material; grinding away portions of said conductor material and of said semiconductor material in spaced regions bordering on said regions ground away earlier, through said surface layer to a depth less than the depth of the earlier grind, in such manner as to disconnect said conductor material deposited on said remaining outer surface regions from said conductor material deposited on said exposed areas of said intermediate portion of said semiconductor material; cutting said semiconductor material along lines between said remaining outer surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion; and etching all junctions between regions of opposite conductivity type on the surfaces of said pieces in such manner as to remove any foreign materials therefrom.

3. In a method of making transistors, the steps of: shaping a piece of semiconductor material into a thin slice having a pair of plane parallel outer surfaces and large enough to provide a plurality of transistors of predetermined size; providing on said surfaces a roughness in the order of that provided by 600-grit silicon carbide; diffusing into each said outer surface a material such as to provide a layer of said semiconductor material at each said surface having conductivity of the type opposite to that of the intermediate portion of said semiconductor material between said layers; grinding away portions of said semiconductor material at parallel spaced regions on one said outer surface, through said surface layer therein to a depth between, and spaced from, both said surface layers, to expose substantial areas of said intermediate portion of said semiconductor material; diffusing into a layer of said exposed areas of said intermediate portion of said semiconductor material a material such as to increase substantially in said areas the conductivity of the same type already present in said intermediate portion; depositing an electrical conductor material on said outer surfaces and on said exposed areas of said intermediate portion of said semiconductor material; grinding away portions of said conductor material and of said semiconductor material in parallel spaced regions bordering on said regions ground away earlier, through said surface layer to a depth less than the depth of the earlier grind, in such manner as to disconnect said conductor material deposited on said remaining outer surface regions from said conductor material deposited on said exposed areas of said intermediate portion of said semiconductor material; cutting said semiconductor material along lines between said remaining outer surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion; and etching all junctions between regions of opposite conductivity type on the surfaces of said pieces in such manner as to remove any foreign materials therefrom.

4. In a method of making transistors from a slice of semiconductor material large enough to provide a plurality of transistors of predetermined size and having a pair of plane parallel outer surfaces approximately twice the desired thickness of said transistors, comprising at each said plane surface a layer of said semiconductor material having conductivity of the type opposite to that of the intermediate portion of said semiconductor material between said layers, the steps of: removing approximately one-half of said slice from one said plane surface to a plane parallel to said surfaces and approximately midway between said surfaces, to provide a remaining slice approximately one-half as thick as the beginning slice; treating at said new surface a layer of said semiconductor material, substantially thinner than said treated layer at the remaining old plane surface, to provide in said new layer conductivity of the type opposite to that of the intermediate portion of said semiconductor material between said layers; removing portions of said semiconductor material at spaced regions on said new surface, through said thinner surface layer therein to a depth between, and spaced from, both said surface layers, to expose substantial areas of said intermediate portion of said semiconductor material; treating said exposed areas of said intermediate portion of said semiconductor material to increase substantially in said areas the conductivity of the same type already present in said intermediate portion; depositing an electrical conductor material on said new surface, on said remaining old surface, and on said exposed areas of said intermediate portion of said semiconductor material; removing portions of said conductor material and of said semiconductor material in spaced regions bordering on said regions removed earlier, through said thinner surface layer to a depth less than the depth of the earlier removal, in such manner as to disconnect said conductor material deposited on said remaining new surface regions from said conductor material deposited on said exposed areas of said intermediate portion of said semiconductor material; and cutting said semiconductor material along lines between said remaining new surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion.

5. In a method of making transistors, the steps of: shaping a piece of semiconductor material into a slice large enough to provide a plurality of transistors of predetermined size and having a pair of plane parallel outer surfaces approximately twice the desired thickness of said transistors; treating at each said plane surface a layer of said semiconductor material to provide in each said layer conductivity of the type opposite to that of the intermediate portion of said semiconductor material between said layers; removing approximately one-half of said slice from one said plane surface to a plane parallel to said surfaces and approximately midway between said surfaces, to provide a remaining slice approximately one-half as thick as the beginning slice; treating at said new surface a layer of said semiconductor material, substantially thinner than said treated layer at the remaining old plane surface, to provide in said new layer conductivity of the type opposite to that of the intermediate portion of said semiconductor material between said layers; grinding away portions of said semiconductor material at spaced regions on said new surface, through said thinner surface layer therein to a depth between, and spaced from, both said surface layers, to expose substantial areas of said intermediate portion of said semiconductor material; treating said exposed areas of said intermediate portion of said semiconductor material to increase substantially in said areas the conductivity of the same type already present in said intermediate portion; depositing an electrical conductor material on said new surface, on said remaining old surface, and on said exposed areas of said intermediate portion of said semiconductor material; grinding away portions of said conductor material and of said semiconductor material in spaced regions bordering on said regions ground away earlier, through said thinner surface layer to a depth less than the depth of the earlier grind, in such manner as to disconnect said conductor material deposited on said remaining new surface regions from said conductor material deposited on said exposed areas of said intermediate portion of said semiconductor material; cutting said semiconductor material along lines between said remaining new surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion; and etching all junctions between regions of opposite conductivity type on the surfaces of said pieces in such manner as to remove any foreign materials therefrom.

6. In a method of making transistors, the steps of: shaping a piece of semiconductor material into a slice large enough to provide a plurality of transistors of predetermined size and having a pair of plane parallel outer surfaces approximately twice the desired thickness of said transistors; providing on said surfaces a roughness in the order of that provided by 600-grit silicon carbide; diffusing into each said plane surface a material such as to provide a layer of said semiconductor material at each said surface having conductivity of the type opposite to that of the intermediate portion of said semiconductor material between said layers; lapping away approximately one-half of said slice from one said plane surface to a plane parallel to said surfaces and approximately midway between said surfaces, to provide a remaining slice approximately one-half as thick as the beginning slice; providing on the resulting new surface a roughness in the order of that provided by 600-grit silicon carbide; diffusing into said new surface a material such as to provide a layer of said semiconductor material at said new surface, substantially thinner than said treated layer at the remaining old plane surface, having conductivity of the type opposite to that of the intermediate portion of said semiconductor material between said layers; grinding away portions of said semiconductor material at parallel spaced regions on said new surface, through said thinner surface layer therein to a depth between, and spaced from, both said surface layers, to expose substantial areas of said intermediate portion of said semiconductor material; diffusing into a layer of said exposed areas of said intermediate portion of said semiconductor material a material such as to increase substantially in said areas the conductivity of the same type already present in said intermediate portion; depositing an electrical conductor material on said new surface, on said remaining old surface, and on said exposed areas of said intermediate portion of said semiconductor material; grinding away portions of said conductor material and of said semiconductor material in parallel spaced regions bordering on said regions ground away earlier, through said thinner surface layer to a depth less than the depth of the earlier grind, in such manner as to disconnect said conductor material deposited on said remaining new surface regions from said conductor material deposited on said exposed areas of said intermediate portion of said semiconductor material; cutting said semiconductor material along lines between said remaining new surface regions so located as to provide a plurality of pieces of said semiconductor material, each said piece having a conductor in electrical contact with an intermediate portion of one type of conductivity and conductors in contact respectively with each of a pair of outer surface layers of conductivity of the type opposite to that of said intermediate portion; and etching all junctions between regions of opposite conductivity type on the surfaces of said pieces in such manner as to remove any foreign materials therefrom.

No references cited.